United States Patent
Mori

[19]

[11] Patent Number: 6,127,231

[45] Date of Patent: Oct. 3, 2000

[54] METHOD OF MAKING TRANSISTORS IN AN IC INCLUDING MEMORY CELLS

[75] Inventor: Hidemitsu Mori, Tokyo, Japan

[73] Assignee: NEC Corporation, Tokyo, Japan

[21] Appl. No.: 09/098,526

[22] Filed: Jun. 17, 1998

[30] Foreign Application Priority Data

Jun. 18, 1997 [JP] Japan ................................. 9-161671

[51] Int. Cl.[7] .............................................. H01L 21/8234
[52] U.S. Cl. ......................................... 438/275; 438/241
[58] Field of Search .................................. 438/241, 253, 438/275, 279, 396

[56] References Cited

U.S. PATENT DOCUMENTS 5,324,680   6/1994   Lee et al. ................................. 438/241
5,856,219   1/1999   Naito et al. ............................. 438/241

FOREIGN PATENT DOCUMENTS 8-21687   3/1996   Japan .

*Primary Examiner*—Chandra Chaudhari
*Attorney, Agent, or Firm*—Young & Thompson

[57] ABSTRACT

A method of fabricating a semiconductor device using the steps of: (a) forming a large number of first transistors having a fixed gate electrode separation in a first region on a semiconductor substrate and forming a large number of second transistors having a gate electrode separation wider than that of the first transistors in a second region on the semiconductor substrate; (b) covering the entire surface of these first and second regions with an insulating film of fixed film thickness; and (c) forming a buried layer consisting of the insulating film between the gate electrodes of the first transistors by etching this entire insulating film and forming side walls consisting of the insulating film on electrodes of the second transistors. In step (c), the spaces between the gate electrodes of the first transistors are filled with insulating film in self-aligned fashion and side walls consisting of insulating film are formed on the gate electrodes of the second transistors so that the space between the gate electrodes, i.e. the diffusion layer of the first transistors, is covered with insulating film and is not exposed to the etching atmosphere.

27 Claims, 24 Drawing Sheets

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

(a) INTERIOR OF MEMORY CELL (b) PERIPHERAL CIRCUITRY SECTION (Nch)

(c) PERIPHERAL CIRCUITRY SECTION (Pch)

METHOD OF MAKING TRANSISTORS IN AN IC INCLUDING MEMORY CELLS

BACKGROUND OF THE INVENTION

1. Field of the Invention

The present invention relates to a method of fabricating a semiconductor device, and in particular relates to a method of fabricating a semiconductor device having special features in the method of forming transistors in an IC including memory cells.

2. Description of the Related Art

The circuitry within a single chip of a memory typified by a DRAM (Dynamic Random Access Memory) can be broadly classified into the memory cell section and peripheral circuitry section. In the case of a DRAM, since, in the transistors in the memory cells, a capacitor is formed on one side of the source/drain region, a high charge-holding performance is demanded. On the other hand, in the transistors of the peripheral circuitry, high current drive capability is demanded in order to achieve high operating speeds. LDD (Lightly Doped Drain) transistors etc. are known as a way of satisfying these demands simultaneously, being claimed to have both high reliability and high current drive capability. In order to form LDD transistors etc. it is necessary to form a side wall on the insulating film on the side face of the gate electrode. However, there is the problem that, when etching in the formation of this sidewall, the diffusion layer in the memory cell is exposed to the etching atmosphere, resulting in the formation of crystal defects. As a result, the charge holding performance is impaired. In order to solve this problem, a method has been proposed whereby, after transistor formation, the transistor surfaces within the memory cells only are covered with insulating film, while the transistor surfaces of the peripheral circuitry section are not covered with insulating film. An example is the method shown in FIG. 12 to FIG. 19 (see Japanese Patent Publication No. H.8-21687).

FIG. 12 to FIG. 19 are cross-sectional views showing a first prior art example. In these Figures, (a), (b) and (c) respectively show the interior of a memory cell, the peripheral circuitry section (Nch), and peripheral circuitry section (Pch).

First of all, as shown in FIG. 12, a field oxide film 2 is formed by the ordinary method of selective oxidation (LOCOS: Local Oxidation of Silicon) etc. on a P-type semiconductor substrate 1. After formation of gate oxide film 3 on the element active regions defined by the field oxide film 2, a conductive film such as for example polysilicon film or tungsten silicide film of film thickness about 200 [nm] for example is grown on the entire surface.

Gate electrodes 4 are formed by patterning this conductive film in a prescribed shape. Then, resist is formed only on the peripheral circuitry section (Pch) and, by for example injection of impurity such as phosphorus, a N-diffusion layer 5 is formed only in the diffusion layer section within the memory cells and peripheral circuitry section (Nch) followed by removal of the resist.

Next, as shown in FIG. 13, a silicon oxide film 6 of film thickness for example about 100 [nm] is grown over the entire surface. Next, as shown in FIG. 14, resist is formed only above the interior of the memory cells and etching of the silicon oxide film 6 is performed, after which the resist is removed. In this way, a condition is produced in which silicon oxide film 6 remains behind on the entire surface in the memory cells whereas, in the case of the peripheral circuitry section, silicon oxide film side walls 8 are formed at the side faces of the gates.

Next, as shown in FIG. 15, a silicon oxide film 25 of film thickness about 200 [nm] for example is formed on the entire surface. Next, as shown in FIG. 16, etching of silicon oxide film 25 is performed and silicon oxide film side walls 26 are formed. Next, resist is formed over the interior of the memory cells and the peripheral circuitry section (Pch) and then, for example injection of impurities such as phosphorus or arsenic, N+ diffusion layer 10 is formed only on peripheral circuitry section (Nch). In addition, a P+ diffusion layer 11 is formed only on peripheral circuitry section (Pch) by injection of impurities such as for example boron or $BF_2$ after formation of resist over the interior of the memory cells and the peripheral circuitry section (Nch).

In addition, as shown in FIG. 17, an inter-layer insulating film 12 such as silicon oxide film containing for example phosphorus or boron of thickness for example about 300 [nm] is grown over the entire surface. After this, apertures are formed in prescribed regions in the memory cells, and a buried conductive film 13 such as polysilicon containing for example phosphorus is formed within the aperture sections. Then, a conductive film such as tungsten silicide film of thickness for example about 200 [nm] is grown over the entire surface and bit lines 14 are formed by patterning this conductive film.

Then, as shown in FIG. 18, after growing over the entire surface an inter-layer insulating film 15 such as silicon oxide film containing phosphorus or boron of film thickness for example about 300 [nm], aperture sections are formed in prescribed regions of inter-layer insulating film 15. Further, by growing a conductive film such as polysilicon containing phosphorus of for example film thickness about 600 [nm] over the entire surface and patterning into the prescribed shape, capacitor lower electrodes 16 are formed.

Next, as shown in FIG. 19, capacitor insulating film 17 such as silicon nitride film of thickness for example about 6 [nm] is grown over the entire surface and then the capacitor upper electrodes 18 are formed, only within the memory cells, by growing conductive film such as polysilicon containing phosphorus of thickness for example about 200 [nm] over the entire surface, followed by patterning. Furthermore, an inter-layer insulating film 19 produced by a composite film of silicon oxide film containing for example phosphorus and boron and non-doped silicon oxide film is grown over the entire surface and aperture sections are then formed in prescribed regions of the peripheral circuitry section. After forming a buried conductive film 20 by a conductive film such as for example tungsten in the interior of the aperture sections, a film such as aluminium or titanium nitride containing for example titanium, titanium nitride, silicon or copper is successively formed, followed by patterning, to form low-resistance wiring 21.

The basic portions of the interior of the memory cells and the peripheral circuitry section of the DRAM can thus be formed as described above. With this first prior art example, since insulating film side walls can be formed on the side face of gate electrodes 4 in the peripheral circuitry section, LDD transistors can be formed in the Nch section while BC-LDD (Buried Channel LDD) transistors can be formed in the Pch section. This makes it possible to improve the reliability of the transistor and to obtain high current drive capability. Also, within the memory cells, since the memory cells are covered by insulating film, the $N^-$ diffusion layer 5 within the memory cells is not exposed to the etching atmosphere, so generation of crystal defects is suppressed, and the charge-holding performance of the memory cells can be improved.

Next, a second prior art example will be described. In the second prior art example, the current drive capability of the transistors is further improved by employing the conventional method of titanium siliciding of the diffusion layer section in the first prior art example. An example of this is the method shown in FIG. 20 to FIG. 24.

First of all, as shown in FIG. 20, a field oxide film 2 is formed on the P⁻ type semiconductor substrate 1 by the ordinary method of selective oxidation (LOCOS), for example. After forming gate oxide film 3 on the element active regions defined by the field oxide film 2, a conductive film such as polysilicon film or tungsten silicide of thickness for example 200 [nm] is grown over the entire surface, and gate electrodes 4 are formed by patterning this conductive film to the prescribed shape. Next, a resist is formed only on the peripheral circuitry section (Pch) and N⁻ diffusion layer 5 is formed only in the diffusion layer section of the interior of the memory cells and the peripheral circuitry section (Nch) by injection of impurity such as for example phosphorus, after which the resist is removed.

Next, a silicon nitride film 27 is grown over the entire surface with a thickness of for example about 100 [nm], as shown in FIG. 21.

Next, silicon nitride film side walls 22 are formed on the side faces of the gate electrodes 4 by performing etching of silicon nitride film 27 as shown in FIG. 22. Next, a N+ diffusion layer 10 is formed only on the peripheral circuitry section (Nch) by injection of impurities such as for example phosphorus or arsenic after forming a resist over the interior of the memory cells and the peripheral circuitry section (Pch).

Furthermore, after forming a resist over the interior of the memory cells and the peripheral circuitry section (Nch), a P+ diffusion layer 11 is formed only in the peripheral circuitry section (Pch) by performing injection of impurity such as for example boron or $BF_2$.

Next, as shown in FIG. 23, titanium having a film thickness of about 80 nm, example, is grown on the entire surface by the sputtering method and heat treatment is performed under a nitrogen atmosphere. Further, unreacted titanium is removed by a mixed liquid of sulphuric acid and hydrogen peroxide. In this way, a titanium silicide film 23 is formed on the gates and a titanium silicide film 24 is formed on the diffusion layers. Although in this case titanium silicide is formed on the diffusion layers, this could be a film of silicide consisting of silicon and a transition metal element such as cobalt silicide. Such a reaction is generally termed saliciding (salicide: abbreviation of Self-Aligned Silicide)

Next, as shown in FIG. 24, an inter-layer insulating film 12 such as silicon oxide film containing for example phosphorus or boron of for example film thickness about 300 [nm] is grown over the entire surface. After this, apertures are formed in prescribed regions within the memory cells, and a buried conductive film 13 such as polysilicon containing for example phosphorus is formed within the aperture section. A conductive film such as tungsten silicide film is grown over the entire surface in a thickness of for example 200 [nm] and then subjected to patterning to form bit lines 14. Then, an inter-layer insulating film 15 such as silicon oxide film containing phosphorus and/or boron of for example film thickness about 300 [nm] is grown over the entire surface, after which aperture sections are formed in prescribed regions of inter-layer insulating film 15. Furthermore, conductive film such as polysilicon containing phosphorus of for example film thickness about 600 [nm] is grown over the entire surface, then patterned to the prescribed shape to form capacitor lower electrodes 16. Then, capacitor insulating film 17 such as silicon nitride film of thickness for example 6 [nm] is grown over the entire surface, after which the capacitor upper electrodes 18 are formed only within the memory cells by patterning after growing conductive film such as polysilicon containing phosphorus of or example film thickness 200 [nm] over the entire surface.

Further, inter-layer insulating film 19 produced using a composite film of silicon oxide film containing for example phosphorus and boron and non-doped silicon oxide film is grown over the entire surface and aperture sections are then formed in prescribed regions of the peripheral circuitry section. A buried conductive film 20 produced by conductive film such as tungsten, for example, is formed within the aperture sections and a film such as aluminium or tungsten nitride containing for example titanium, titanium nitride, silicon or copper is then successively formed and subjected to patterning to form low-resistance wiring 21.

With this second prior art example, improvement in the current drive capability is obtained by saliciding the top of the diffusion layer. Also, lowering of the resistance of the gate electrodes is achieved by saliciding the top of the gate electrodes.

However, these prior art examples are subject to the following problems.

The first problem relates to the first prior art example. Specifically, when silicon oxide film side wall 8 is formed on the side face of the gate electrodes of the peripheral circuitry section, it is necessary to cover the interior of the memory cells by a resist in order that the interior of the memory cells should not be exposed to the etching atmosphere. This therefore necessitates increase of the number of steps by one in each case for the lithography and oxide film etching, respectively, as well as construction of a reticle for the lithography.

The second problem relates to the second prior art example. Specifically, a deep junction must be formed in the N⁻ diffusion layer 5 within the memory cells in order to withstand saliciding of the diffusion layer. This therefore tends to produce the effect of shortening the channels of the transistor, which is disadvantageous in regard to reducing the overall size of the DRAM memory cell. Also, the number of defects is increased by saliciding of the N⁻ diffusion layer 5, increasing junction leakage of the N⁻ diffusion layer 5 section. Deterioration of the charge-holding performance of the memory cell therefore occurs.

SUMMARY OF THE INVENTION

A first object of the present invention is to provide a method of fabricating a semiconductor device whereby the diffusion layer section within a memory cell can be prevented from being exposed to the etching atmosphere without adding a special step, when forming an insulating film side wall on a gate electrode side face, in order to form an LDD transistor having high reliability and high current drive capacity in the peripheral circuitry section. second object of the present invention is to provide a method of fabricating a semiconductor device whereby the channel-shortening effect of a transistor in a memory cell can be suppressed and increase of junction leakage can be suppressed, by arranging that saliciding is not performed on the diffusion layer in a memory cell when saliciding of the diffusion layer section is performed in order to improve the current drive capability of the peripheral circuitry section.

A method of fabricating a semiconductor device according to the present invention basically comprises the steps of: (a) forming a large number of first transistors having a fixed gate electrode separation in a first region on a semiconductor substrate and forming a large number of second transistors having a gate electrode separation wider than said first transistors in a second region on said semiconductor substrate; (b) covering the entire surface of these first and second regions with an insulating film of fixed film thickness; and (c) forming a buried layer consisting of said insulating film between the gate electrodes of said first transistors by etching this entire insulating film and forming side walls consisting of said insulating film on said gate electrodes of said first transistors. Also, the film thickness D of the insulating film and the gate electrode separation S of the first transistors are preferably set such that the relationship: $S<2\times D$ holds. For example said semiconductor device is a memory element, said first region is the interior of memory cells, and said second region is a peripheral circuitry section.

In step (c), in the case of the first transistors, the intervals between the gate electrodes are filled with insulating film in self-aligned fashion; in the case of the second transistors, side walls of insulating film are formed on the gate electrodes. In this way, in the etching of step (c), the intervals between the gate electrodes, i.e. the diffusion layer of the first transistors, are covered by insulating film and so cannot be exposed to the etching atmosphere.

In addition, after step (c), there may be added the steps of: (d) covering the entire surface of said first and second regions with metallic film and (e) heating for reaction of this metallic film and the base material of said semiconductor substrate. In step (d), the surface of the diffusion layer (between the gate electrodes) of the first transistors is covered with insulating film and the surface of the diffusion layer (between the gate electrodes) of the second transistors is removed except for the portion at the side walls. Consequently, in step (e), the diffusion layer of the first transistors does not react with the metallic layer and the diffusion layer of the second transistors reacts with the metallic layer.

Also, as the method of covering the insulating film of step (b), a method is desirable that provides good step coverage, such as CVD (Chemical Vapour Deposition) or sputtering. Preferably the etching method of the insulating film 6 of step (c) is a method in which anisotropic etching is performed by RIE (Reacting Ion Etching), for example. In these cases, buried layers consisting of insulating film and side walls consisting of insulating film can be formed in a simple manner. Specifically, if the insulating film is grown by a method that provides good step coverage, the insulating film in the portions that constitute the buried layer and side walls can be formed of large thickness. Thus, these portions of large thickness can be reliably left behind on removal of this insulating film by anisotropic etching.

BRIEF DESCRIPTION OF THE DRAWINGS

FIG. 8(a) being the interior of a memory cell, FIG. 8(b) being a peripheral circuitry section (Nch) and FIG. 8(c) being a peripheral circuitry section (Pch);

DESCRIPTION OF THE PREFERRED EMBODIMENTS

Figure 1:
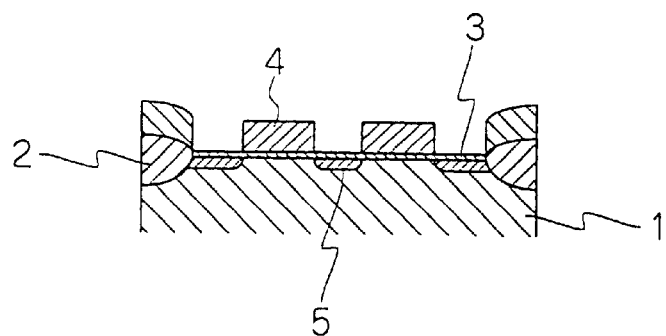
FIG. 1 is a cross-sectional view showing an initial step of a first embodiment, FIG. 1(a) being the interior of a memory cell, FIG. 1(b) being a peripheral circuitry section (Nch), and FIG. 1(c) being a peripheral circuitry section (Pch)
Figure 1:
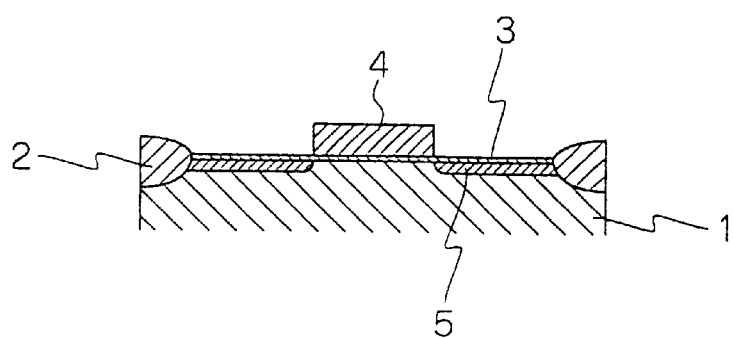
Figure 1:
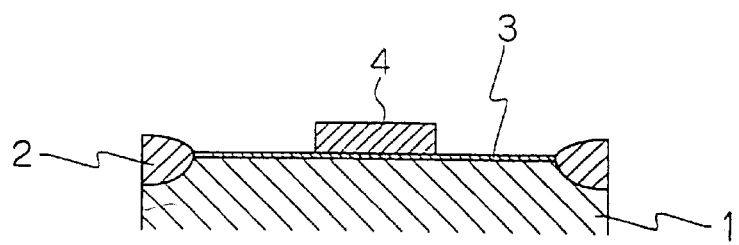
Figure 2:
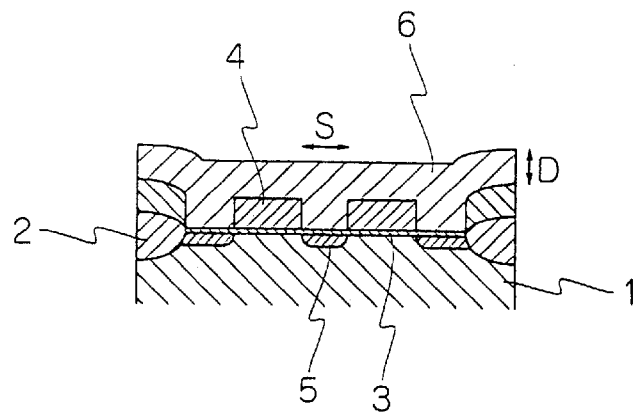
FIG. 2 is a cross-sectional view showing an initial step of a first embodiment of the present invention, FIG. 2(a) being the interior of a memory cell, FIG. 2(b) being a peripheral circuitry section (Nch) and FIG. 2(c) being a peripheral circuitry section (Pch)
Figure 2:
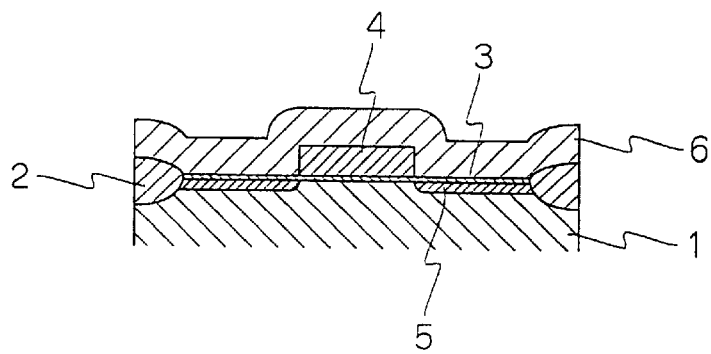
Figure 2:
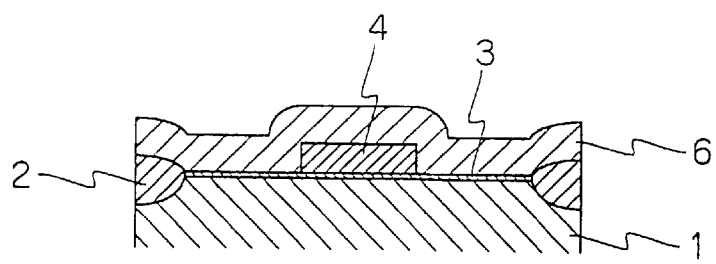
Figure 3:
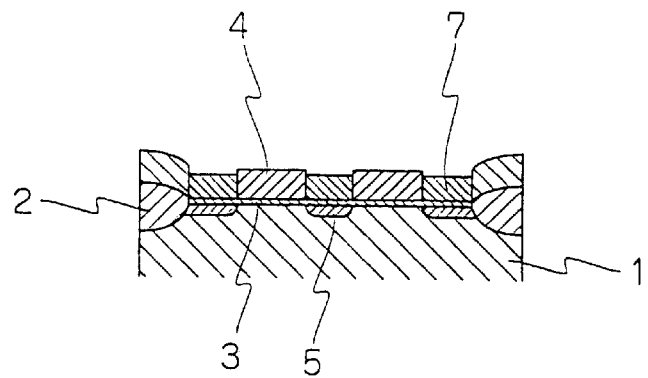
FIG. 3 is a cross-sectional view showing an intermediate step of a first embodiment of the present invention, FIG. 3(a) being the interior of a memory cell, FIG. 3(b) being a peripheral circuitry section (Nch) and FIG. 3(c) being a peripheral circuitry section Pch)
Figure 3:
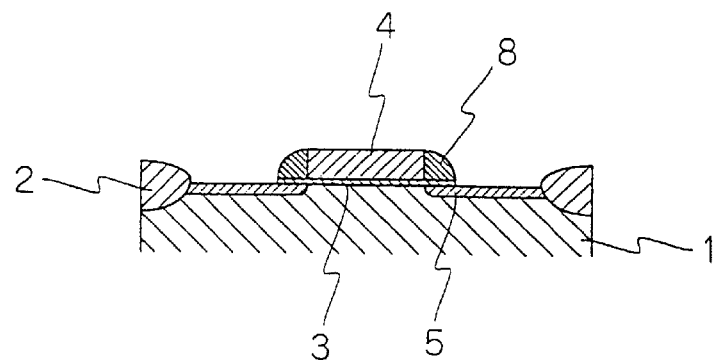
Figure 3:
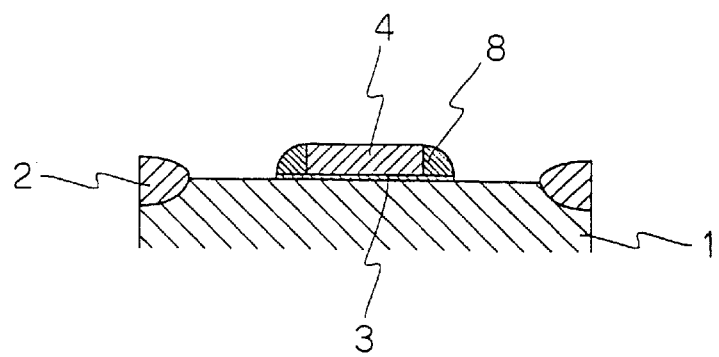
Figure 4:
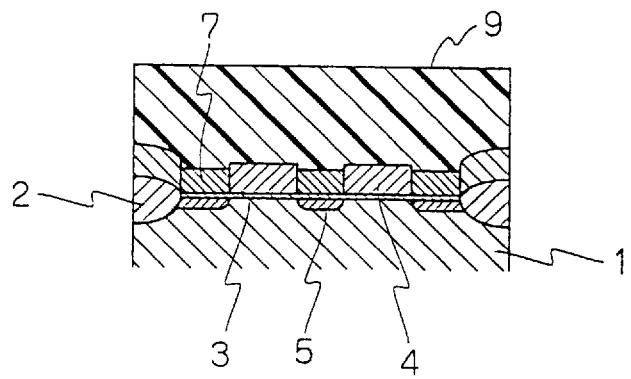
FIG. 4 is a cross-sectional view showing an intermediate step of a first embodiment of the present invention, FIG. 4(a) being the interior of a memory cell, FIG. 4(b) being a peripheral circuitry section (Nch), and FIG. 4(c) being a peripheral circuitry section (Pch)
Figure 4:
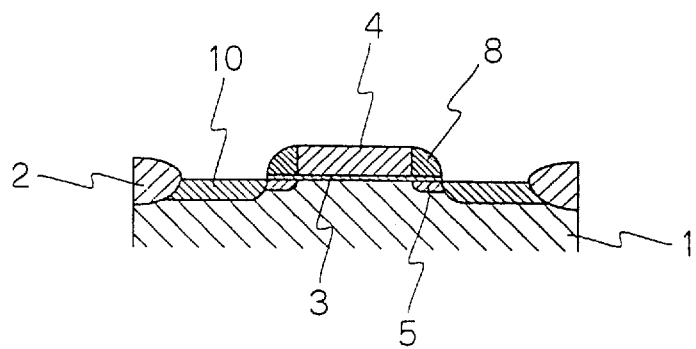
Figure 4:
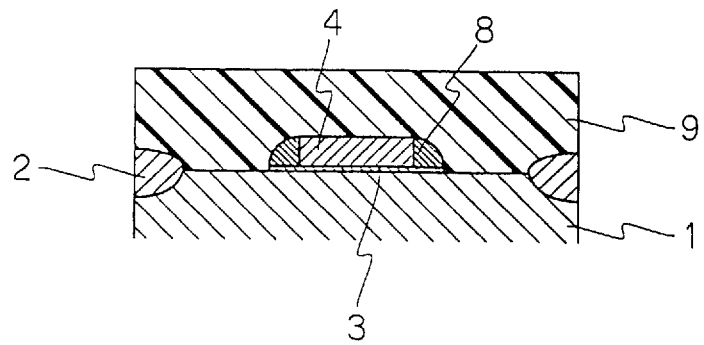
Figure 5:
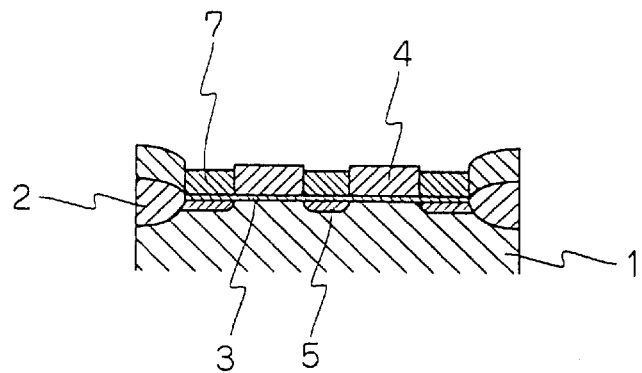
FIG. 5 is a cross-sectional view showing a major step of a first embodiment of the present invention, FIG. 5(a) being the interior of a memory cell, FIG. 5(b) being a peripheral circuitry section (Nch), and FIG. 5(c) being a peripheral circuitry section (Pch)
Figure 5:
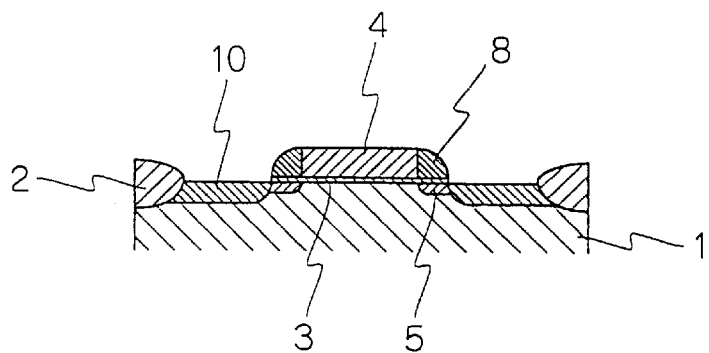
Figure 5:
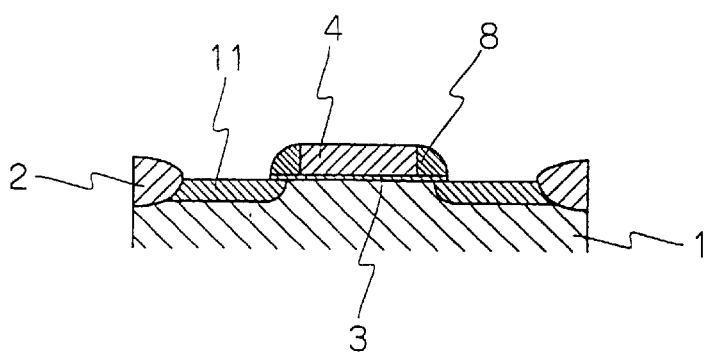
Figure 6:
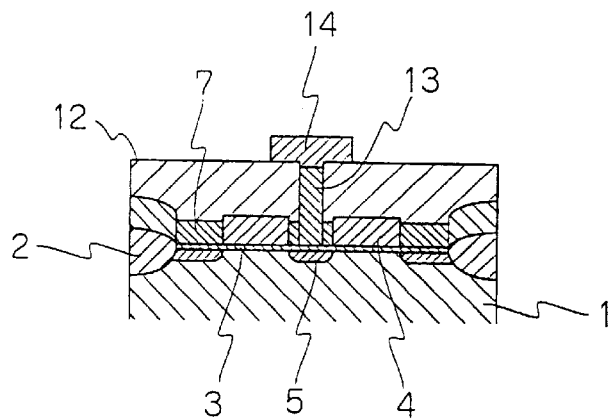
FIG. 6 is a cross-sectional view showing a later step of a first embodiment of the present invention, FIG. 6(a) being the interior of a memory cell, FIG. 6(b) being a peripheral circuitry section (Nch) and FIG. 6(c) being a peripheral circuitry section (Pch)
Figure 6:
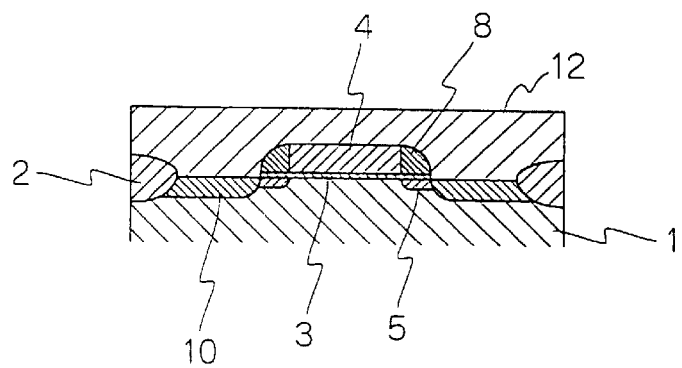
Figure 6:
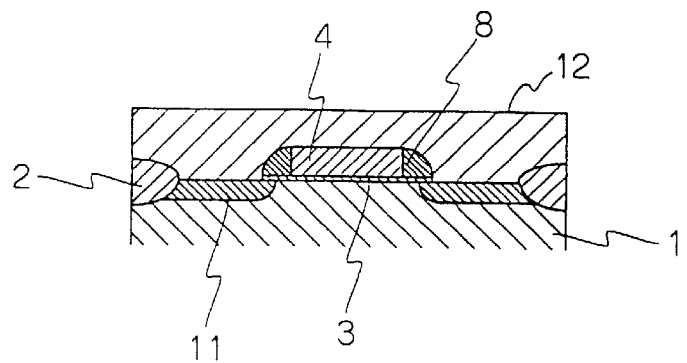
Figure 7:
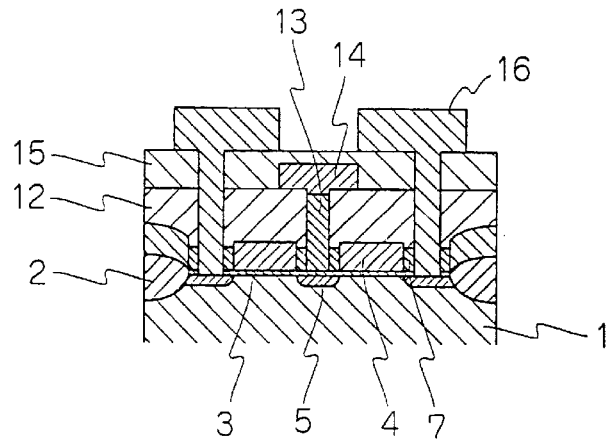
FIG. 7 is a cross-sectional view showing a later step of a first embodiment of the present invention, FIG. 7(a) being the interior of a memory cell, FIG. 7(b) being a peripheral circuitry section (Nch) and FIG. 7(c) being a peripheral circuitry section (Pch)
Figure 7:
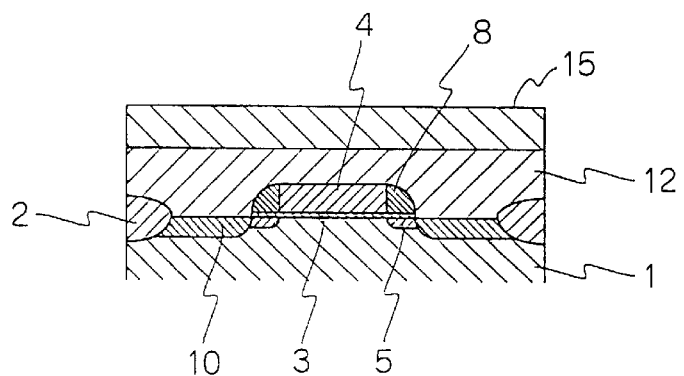
Figure 7:
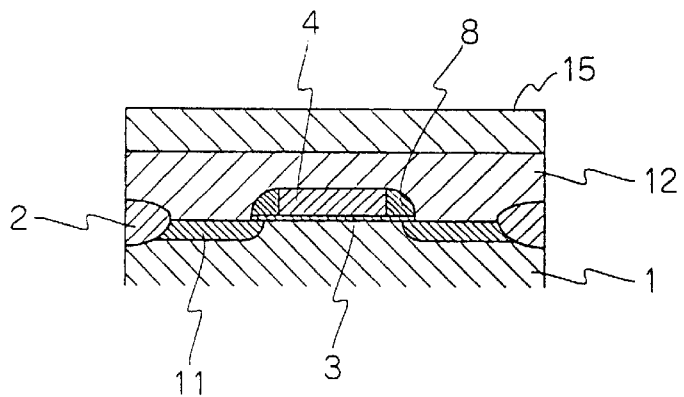
Figure 8:
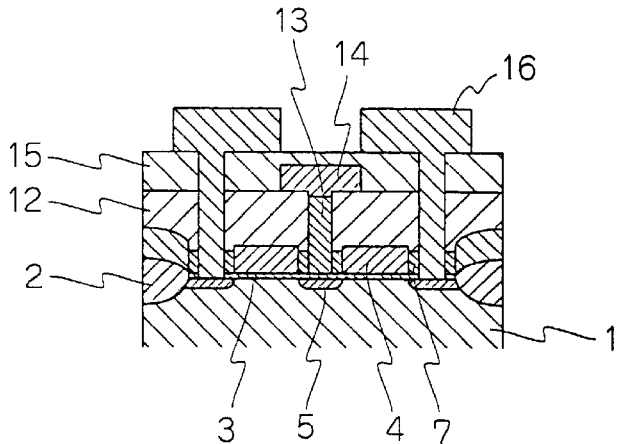
FIG. 8 is a cross-sectional view showing the final step of a first embodiment of the present invention.
Figure 8:
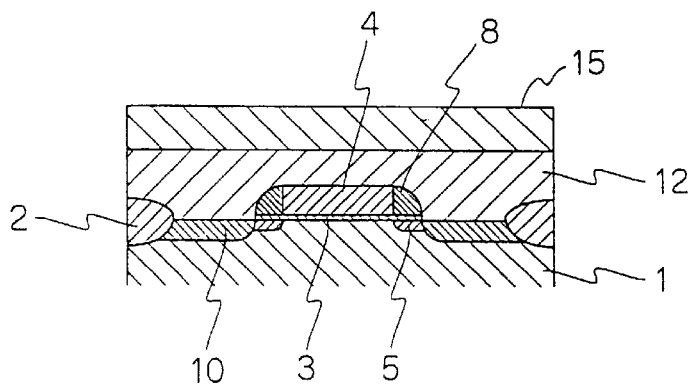
Figure 8:
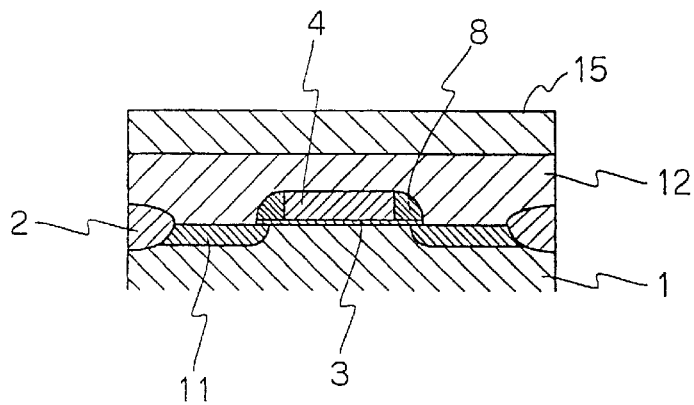

Next, a first embodiment of the present invention will be described with reference to the drawings. FIG. 1 and FIG. 2 are cross-sectional views of an initial step, FIG. 3 and FIG. 4 are cross-sectional views of a intermediate step, FIG. 5 is a cross-sectional view of a major step, FIG. 6 and FIG. 7 are cross-sectional views of a later step, and FIG. 8 is a cross-sectional view of a final step. In these Figures, (a), (b) and (c) indicate respectively the interior of a memory cell, a peripheral circuitry section (Nch), and a peripheral circuitry section (Pch).

First of all, as shown in FIG. 1, a field oxide film 2 is formed on $P^-$ type semiconductor substrate (silicon) 1 by the ordinary selective oxidation (LOCOS) method, for example. In regard to field oxide film 2, apertures may be formed in the substrate and separation effected into trenches with oxide film buried therein or another method of formation may be adopted. After forming gate oxide film 3 on the element active regions defined by field oxide film 2, conductive film such as polysilicon film or tungsten silicide film is grown over the entire surface in a thickness of about for example 200 [nm] and gate electrodes 4 are formed by patterning this conductive film to a prescribed shape. A $N^-$ diffusion layer 5 is formed only in the diffusion layer section of the interior of the memory cells and peripheral circuitry section (Nch) by forming resist only on peripheral circuitry section (Pch) and injection of impurity such as for example phosphorus, followed by removal of the resist. In this embodiment, the same impurity is injected concurrently for the $N^-$ diffusion layers of the interior of the memory cells and peripheral circuitry section (Nch) but separate injections of impurity could be performed by respective separate patterning.

Next, a silicon oxide film 6 is grown over the entire surface as shown in FIG. 2. In this case, if the separation of the gate electrodes 4 is S and the film thickness of the silicon oxide film 6 is D, D and S are determined such that S<2×D. For example, if S=150 [nm] D should be at least 75 [nm]. By this means, within the memory cells, a configuration is produced in which the spaces between the gates are filled by silicon oxide film 6.

Next, etching of silicon oxide film 6 is performed as shown in FIG. 3. By this means, within the memory cells, silicon oxide film 6 remains between the gate electrodes, forming buried silicon oxide film 7. In contrast, in the peripheral circuitry section, silicon oxide film is left behind only on the side faces of the gate electrodes, forming silicon oxide film side walls 8.

Also, for the method of growing silicon oxide film 6 over the entire surface in FIG. 2, a method whereby good step coverage can be achieved, such as CVD or sputtering, is desirable. For the etching method of silicon oxide film 6 in FIG. 3, a method that provides anisotropic etching, such as RIE, is desirable. Using these, buried silicon oxide film 7 and silicon oxide side walls 8 can be formed in a straightforward manner. Specifically, if silicon oxide film 6 in FIG. 2 is grown by a method that provides good step coverage, a thick silicon oxide film 6 of the portions constituting the buried silicon oxide film 7 and silicon oxide side walls 8 can be formed. If silicon oxide film 6 is removed by anisotropic etching, these thick portions can be left behind in a reliable manner.

Next, $N^+$ diffusion layer 10 is formed only in peripheral circuitry section (Nch) by forming resist 9 on memory cell interiors and peripheral circuitry section (Pch) as shown in FIG. 4 then injecting impurity such as phosphorus or arsenic, for example, followed by removal of resist 9.

Next, as shown in FIG. 5, P+diffusion layer 11 is formed only in peripheral circuitry section (Pch) by forming a resist above the memory cell interiors and peripheral circuitry section (Nch), then injecting impurity such as for example boron or $BF_2$, followed by removal of the resist. In this way, all the transistor sections of the memory cell interiors and peripheral circuitry section are formed.

In addition, as shown in FIG. 6, an inter-layer insulating film 12 such as silicon oxide film containing for example phosphorus and/or boron and of thickness for example about 300 [nm] is grown over the entire surface. After this, apertures are formed in prescribed regions within the memory cells and a buried conductive film 13 such as polysilicon containing for example phosphorus is formed within the aperture sections. Bit lines 14 are then formed by growing a conductive film such as tungsten silicide film of thickness for example 200 [nm] on the entire surface, followed by patterning.

Next, as shown in FIG. 7, an inter-layer insulating film 15 such as silicon oxide film containing phosphorus and/or boron of thickness for example about 300 [nm] is grown over the entire surface and aperture sections are then formed in prescribed regions of inter-layer insulating film 15. In addition, the capacitor lower electrodes 16 are formed by growing a conductive film such as polysilicon containing phosphorus of thickness for example about 600 [nm] over the entire surface, followed by patterning to the prescribed shape. Capacitor lower electrodes 16 are normally of the circular pillar shape or rectangular shape called "stacked" type, but they could be processed to a three-dimensional structure called "cylinder" type or "fin" type etc.

Next, capacitor insulating film 17 such as silicon nitride film of thickness for example 60 [nm] is grown over the entire surface as shown in FIG. 8, after which capacitor upper electrodes 18 are formed only within the memory cells by growing a conductive film such as polysilicon containing phosphorus of a thickness of for example 200 [nm] over the entire surface, followed by patterning. Capacitor insulating film 17 is formed by silicon nitride film, but could be formed by high dielectric film such as tantalum oxide film or a composite film produced by silicon nitride film/silicon oxide film. When such a high dielectric film is used, a conductor such as platinum, ruthenium, or iridium is used as the upper and lower electrodes. Furthermore, after growing an inter-layer insulating film 19 constituted by a composite film of non-doped silicon oxide film and silicon oxide film containing for example phosphorus and boron on the entire surface, aperture sections are formed in prescribed regions of the peripheral circuitry section. Next, a buried conductive film 20 produced for example using conductive film such as tungsten is formed in the aperture sections and a film such as aluminium or titanium nitride containing for example titanium, titanium nitride, silicon or copper is successively formed, after which patterning is carried out to form low resistance wiring 21. The basic portions of the peripheral circuitry section and interiors of the memory cells of a DRAM can thus be formed.

In this embodiment, when silicon oxide film side walls 8 are formed on the gate electrode side faces of the peripheral circuitry section, within the memory cells, the spaces between the gate electrodes are filled by buried silicon oxide film 7 in self-alignment fashion. Thanks to this, there is no possibility of N diffusion layer 5 within the memory cells being exposed to the etching atmosphere during formation of silicon oxide film side walls 8.

Figure 9:
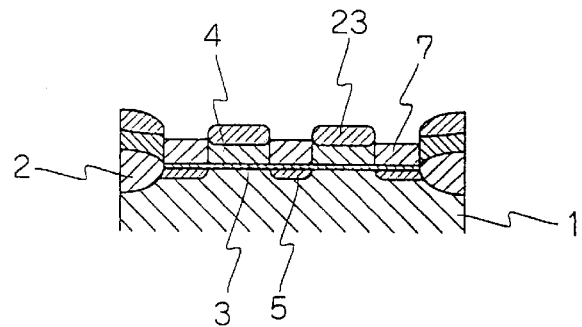
FIG. 9 is a cross-sectional view showing a major step of a second embodiment of the present invention, FIG. 9(a) being the interior f a memory cell, FIG. 9(b) being a peripheral circuitry section (Nch) and FIG. 9(c) being a peripheral circuitry section (Pch)
Figure 9:
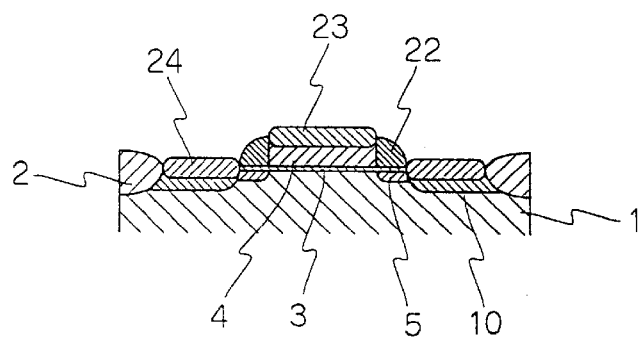
Figure 9:
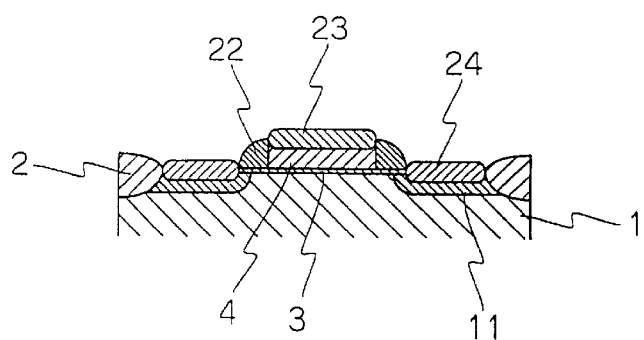
Figure 10:
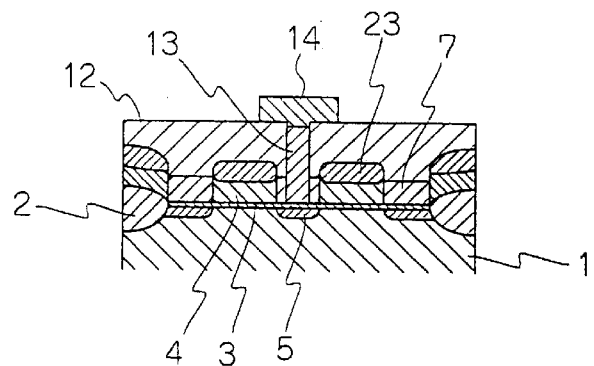
FIG. 10 is a cross-sectional view showing a major step of a second embodiment of the present invention, FIG. 10(a) being the interior of a memory cell, FIG. 10(b) being a peripheral circuitry section (Nch), and FIG. 10(c) being a peripheral circuitry section (Pch)
Figure 10:
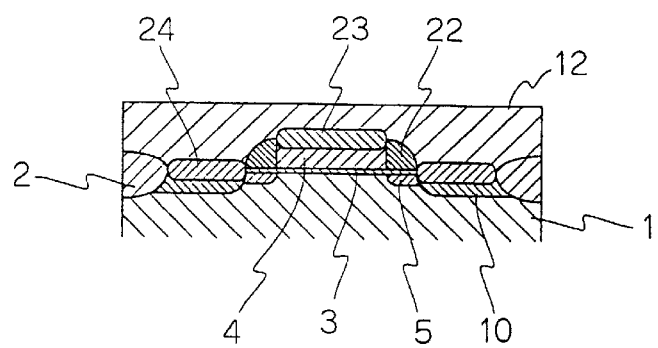
Figure 10:
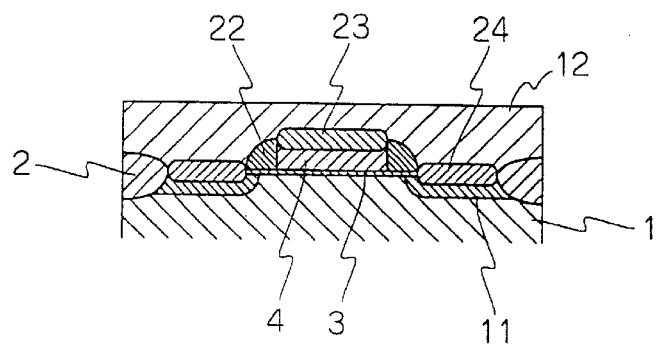
Figure 11:
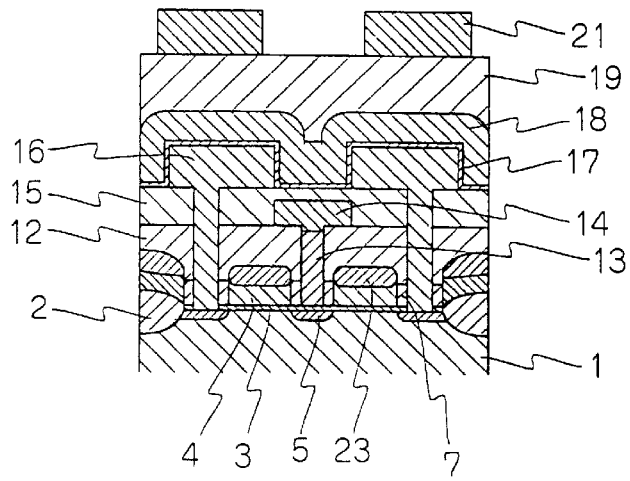
FIG. 11 is a cross-sectional view showing a final step of a second embodiment of the present invention, FIG. 11(a) being the interior of a memory cell, FIG. 11(b) being a peripheral circuitry section (Nch) and FIG. 11(c) being a peripheral circuitry section (Pch)
Figure 11:
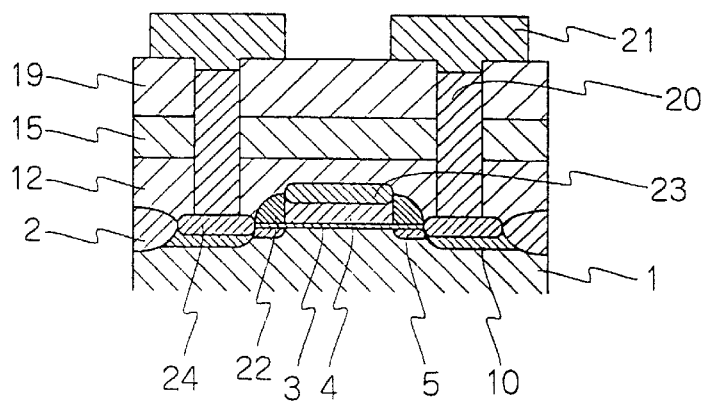
Figure 11:
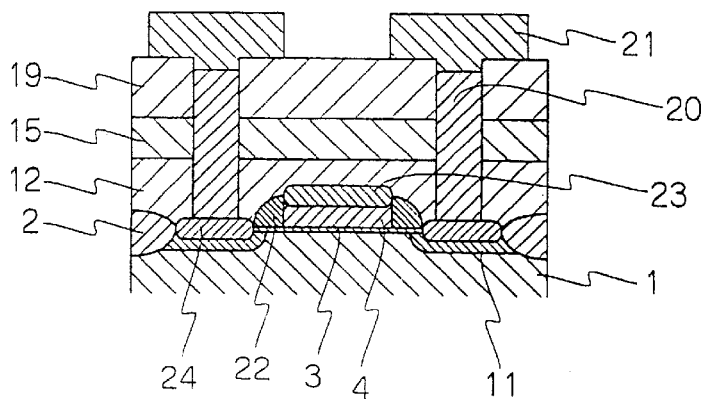
Figure 12:
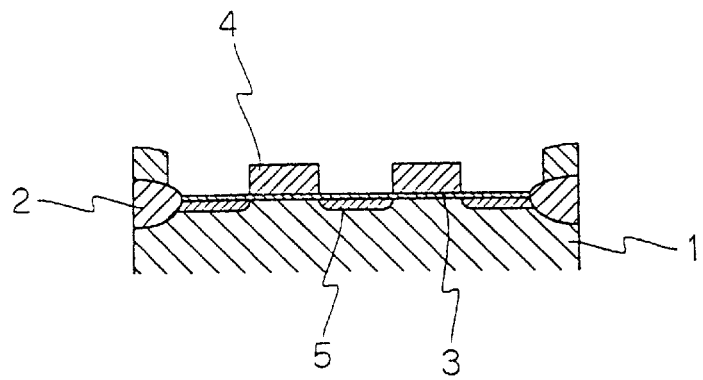
FIG. 12 is a cross-sectional view showing the initial step of a prior art example, FIG. 12(a) being the interior of a memory cell, FIG. 12(b) being a peripheral circuitry section (Nch) and FIG. 12(c) being a peripheral circuitry section (Pch)
Figure 12:
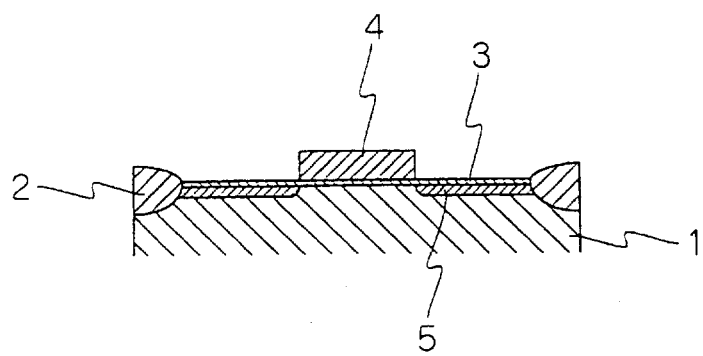
Figure 12:
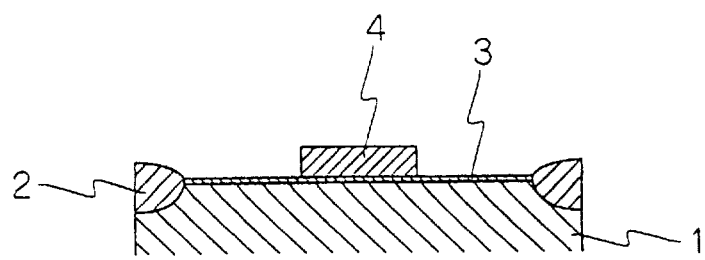
Figure 13:
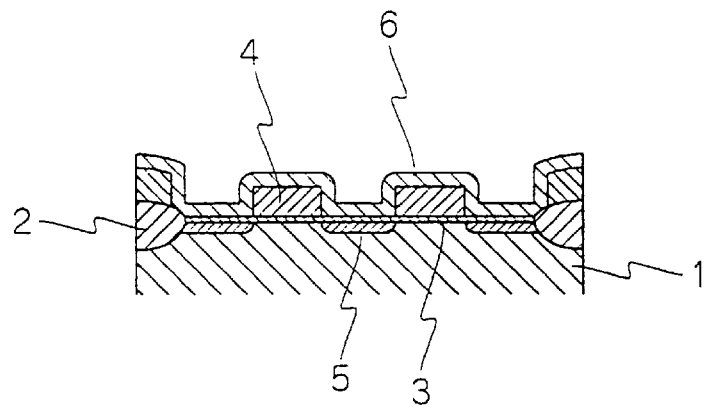
FIG. 13 is a cross-sectional view showing an initial step of a first prior art example, FIG. 13(a) being the interior of a memory cell, FIG. 13(b) being a peripheral circuitry section (Nch), and FIG. 13(c) being a peripheral circuitry section (Pch)
Figure 13:
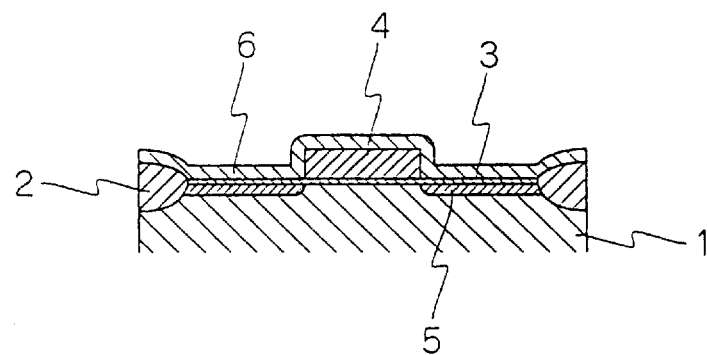
Figure 13:
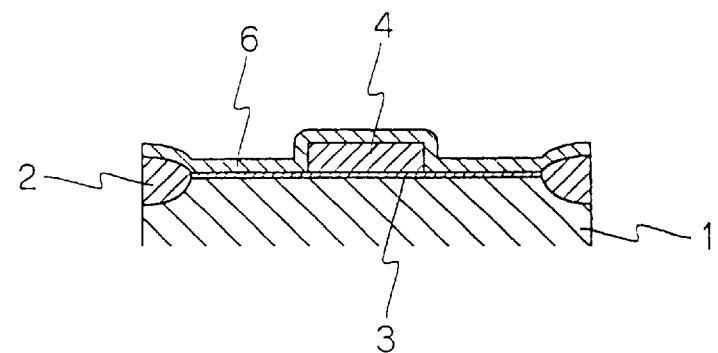
Figure 14:
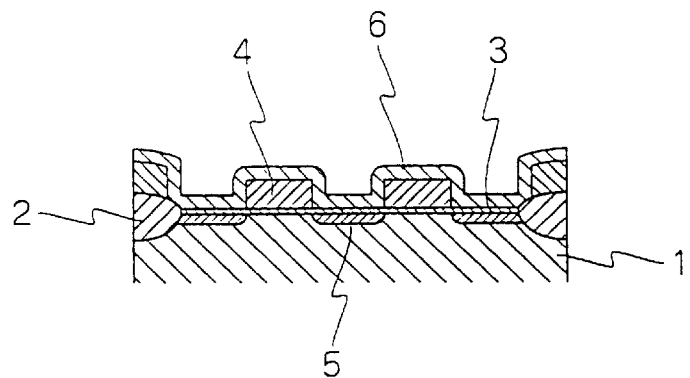
FIG. 14 is a cross-sectional view showing an intermediate step of a first prior art example, FIG. 14(a) being the interior of a memory cell, FIG. 14(b) being a peripheral circuitry section (Nch), and FIG. 14(c) being a peripheral circuitry section (Pch)
Figure 14:
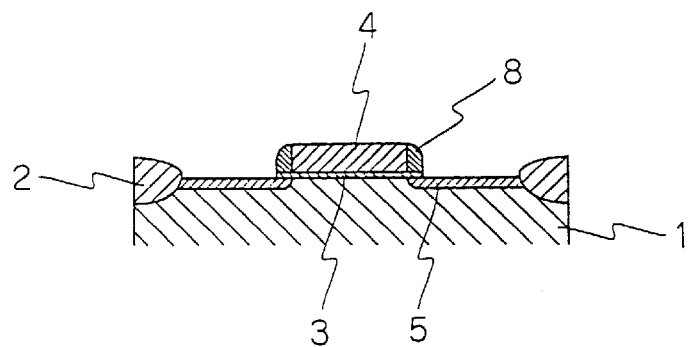
Figure 14:
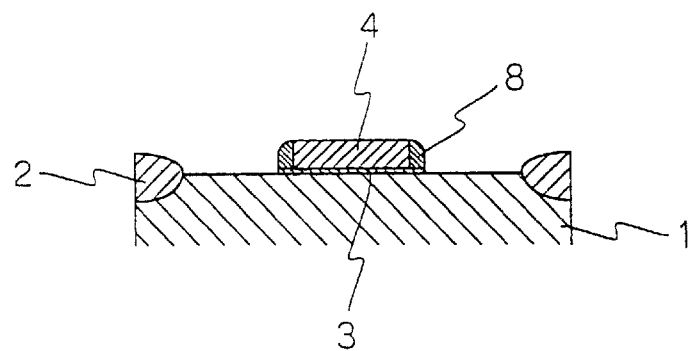
Figure 15:
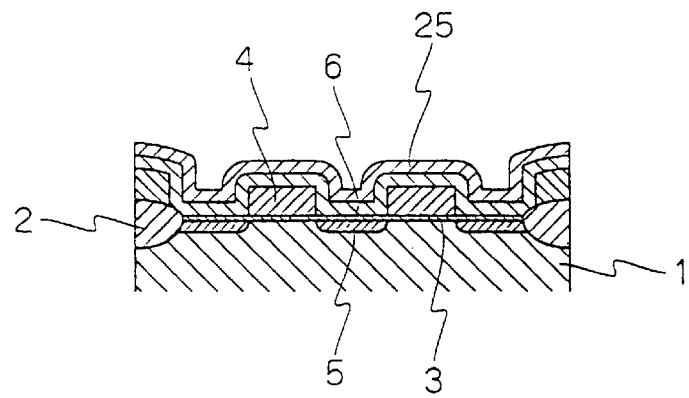
FIG. 15 is a cross-sectional view showing an intermediate step of a first prior art example, FIG. 15(a) being the interior of a memory cell, FIG. 15(b) being a peripheral circuitry section (Nch) and FIG. 15(c) being a peripheral circuitry section (Pch)
Figure 15:
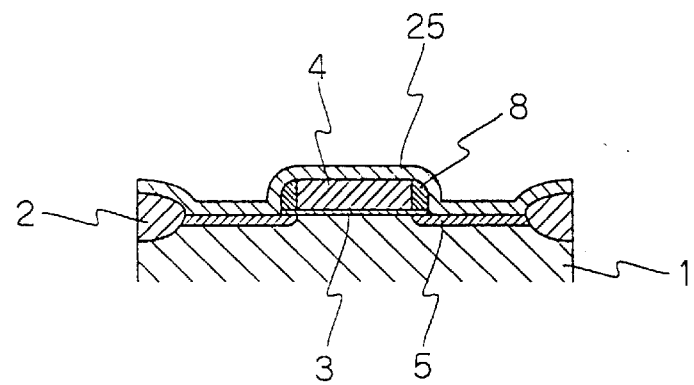
Figure 15:
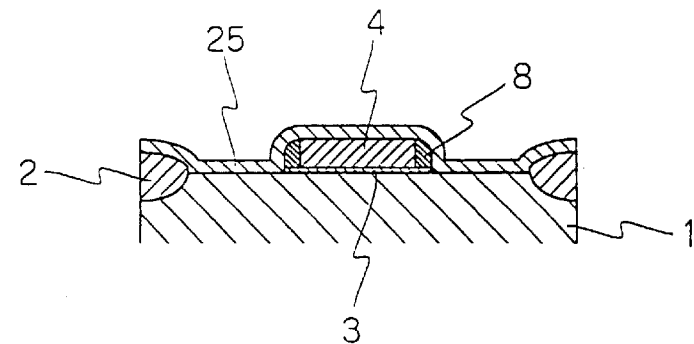
Figure 16:
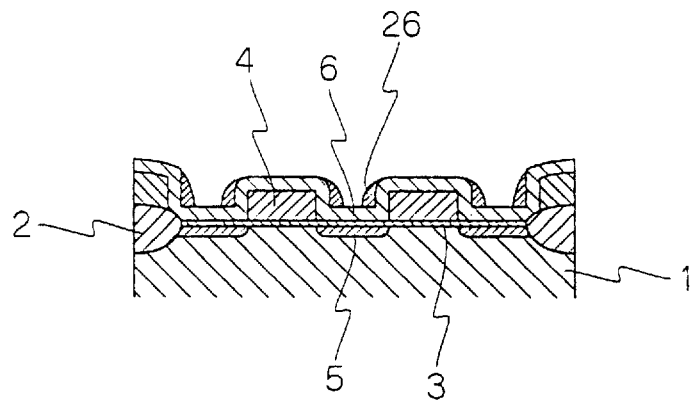
FIG. 16 is a cross-sectional view showing a major step of a first prior art example, FIG. 16(a) being the interior of a memory cell, FIG. 16(b) being a peripheral circuitry section (Nch), and FIG. 16(c) being a peripheral circuitry section (Pch)
Figure 16:
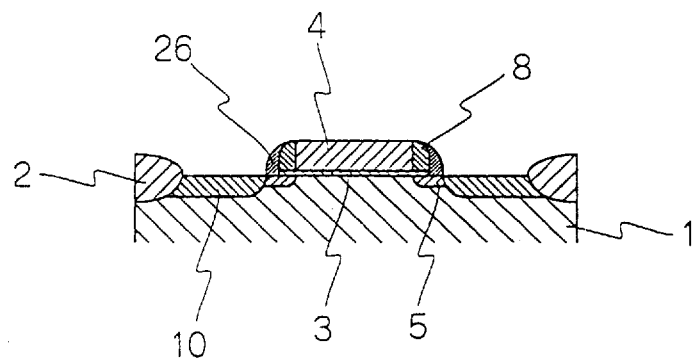
Figure 16:
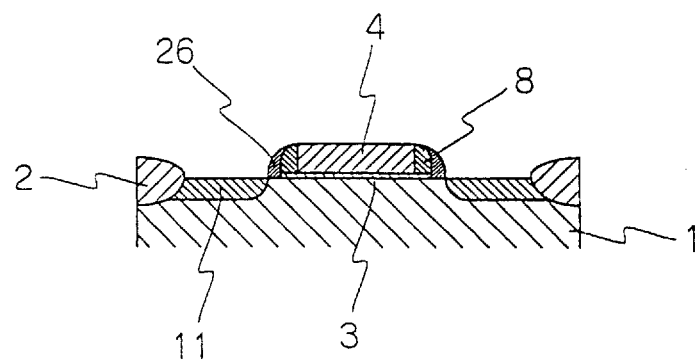
Figure 17:
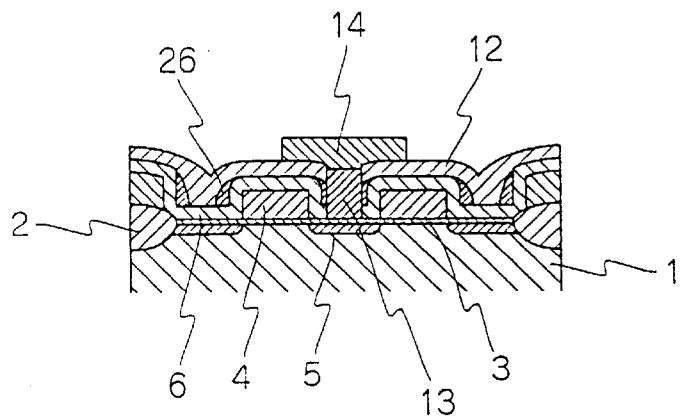
FIG. 17 is a cross-sectional view showing a major step of a first prior art example, FIG. 17(a) being the interior of a memory cell, FIG. 17(b) being a peripheral circuitry section (Nch), and FIG. 17(c) being a peripheral circuitry section (Pch)
Figure 17:
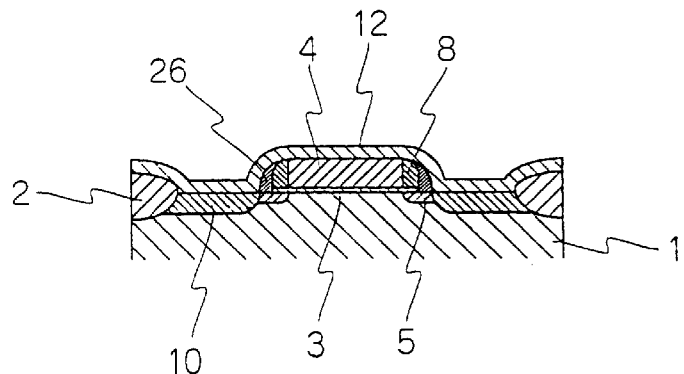
Figure 17:
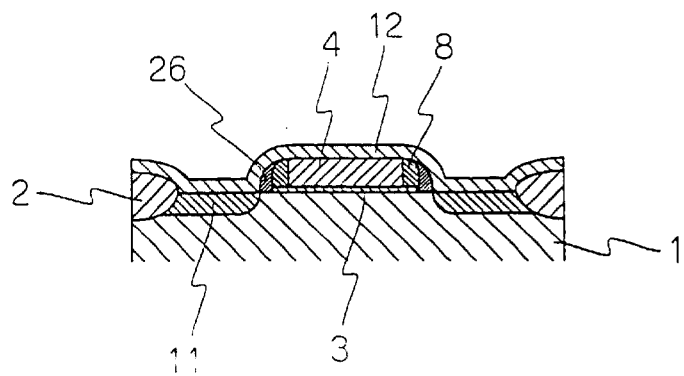
Figure 18:
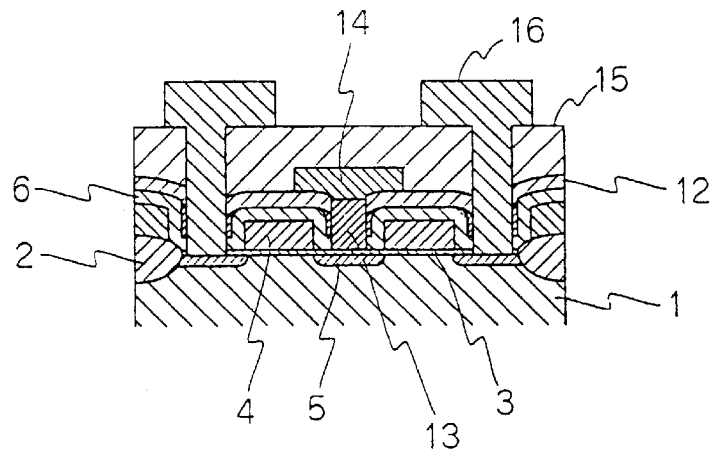
FIG. 18 is a cross-sectional view showing a later step of a first prior art example, FIG. 18(a) being the interior of a memory cell, FIG. 18(b) being a peripheral circuitry section (Nch), and FIG. 18(c) being a peripheral circuitry section (Pch)
Figure 18:
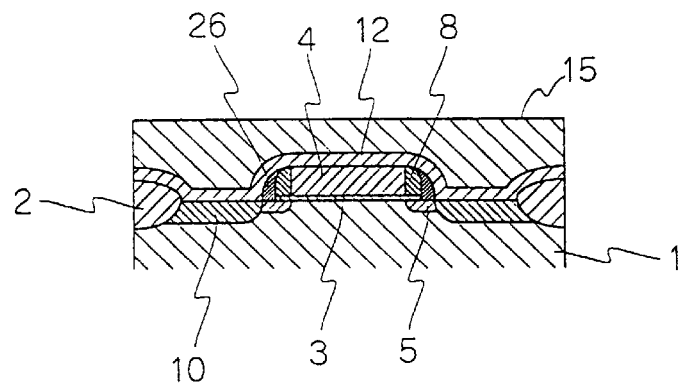
Figure 18:
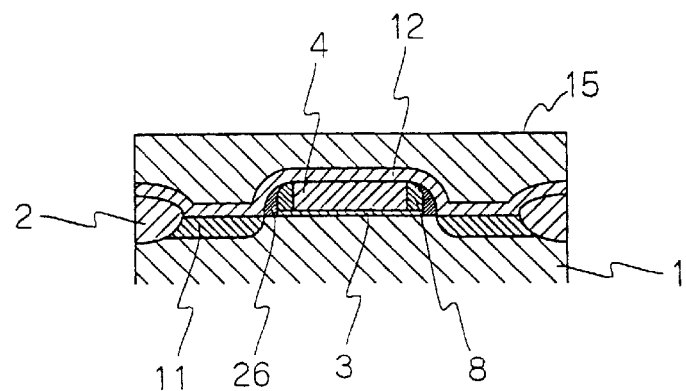
Figure 19:
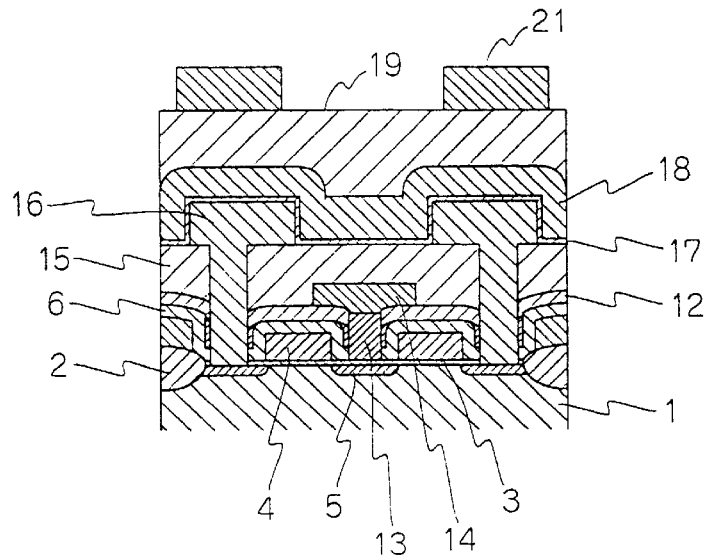
FIG. 19 is a cross-sectional view showing the final step of a first prior art example, FIG. 19(a) being the interior of a memory cell, FIG. 19(b) being a peripheral circuitry section (Nch), and FIG. 19(c) being a peripheral circuitry section (Pch)
Figure 19:
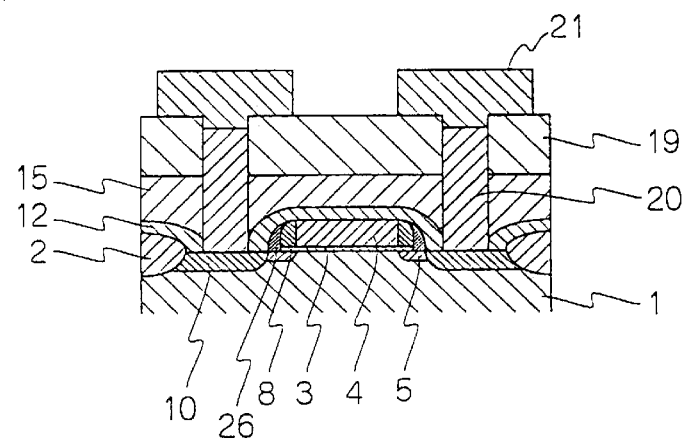
Figure 19:
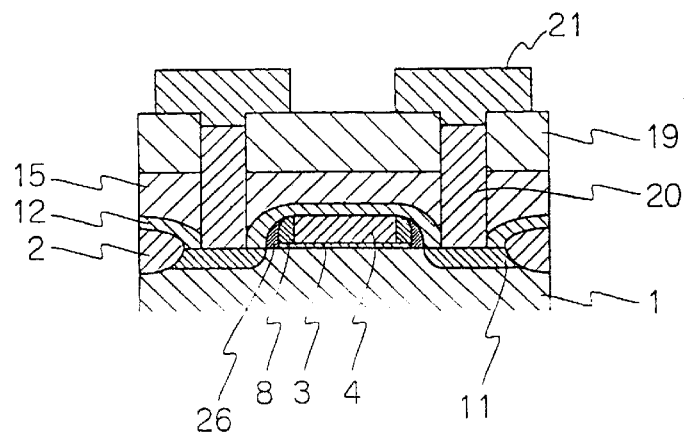
Figure 20:
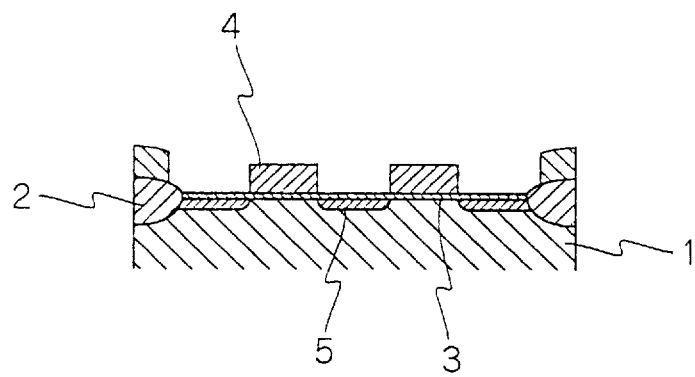
FIG. 20 is a cross-sectional view showing a major step of a second prior art example, FIG. 20(a) being the interior of a memory cell, FIG. 20(b) being a peripheral circuitry section (Nch), and FIG. 20(c) being a peripheral circuitry section (Pch)
Figure 20:
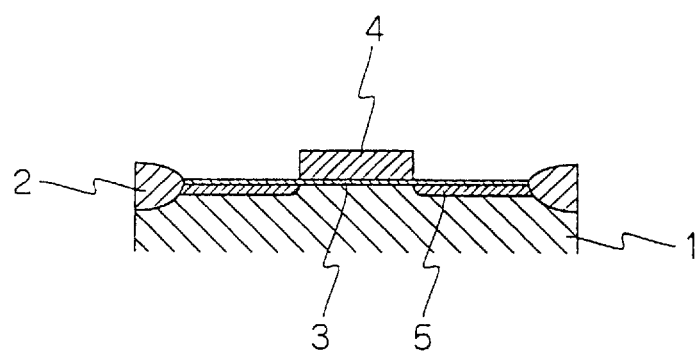
Figure 20:
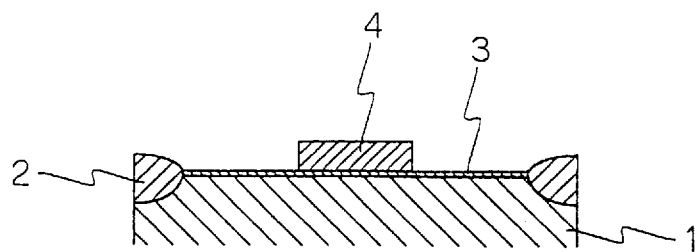
Figure 21:
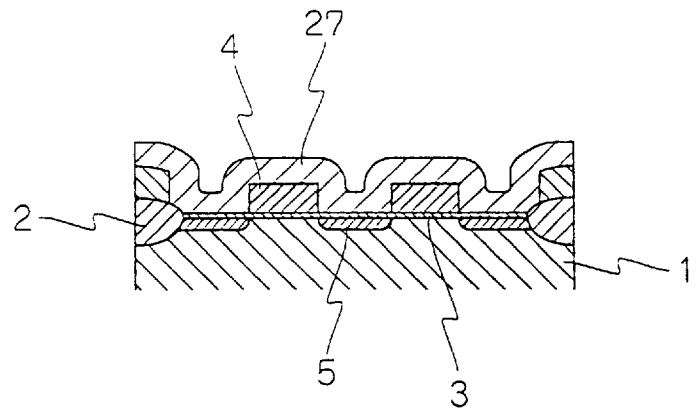
FIG. 21 is a cross-sectional view showing a major step of a second prior art example, FIG. 21(a) being the interior of a memory cell, FIG. 21(b) being a peripheral circuitry section (Nch), and FIG. 21(c) being a peripheral circuitry section (Pch)
Figure 21:
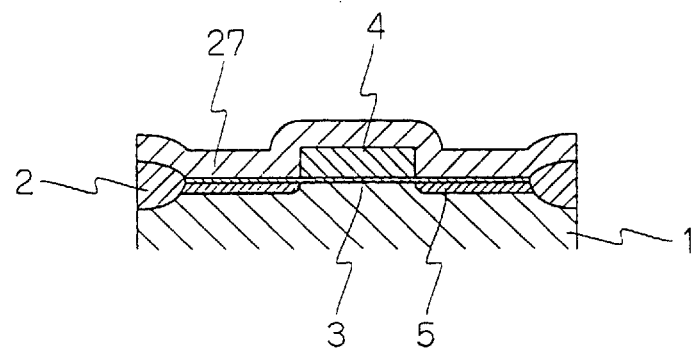
Figure 21:
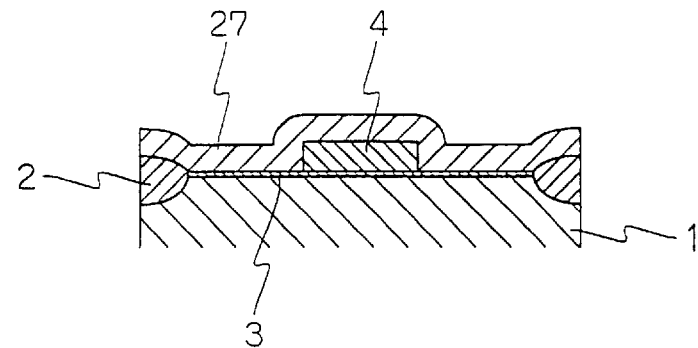
Figure 22:
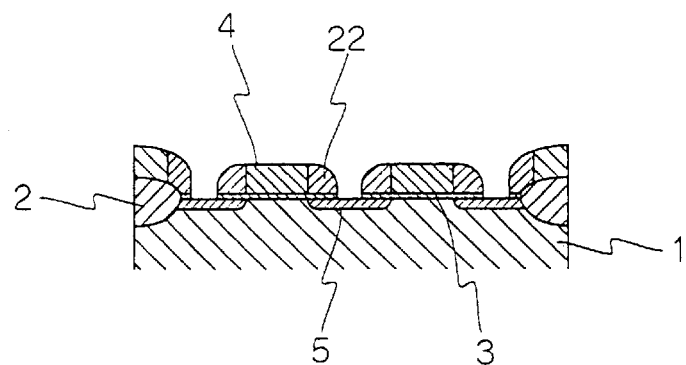
FIG. 22 is a cross-sectional view showing a later step of a prior art example, FIG. 22(a) being the interior of a memory cell, FIG. 22(b) being a peripheral circuitry section (Nch), and FIG. 22(c) being a peripheral circuitry section (Pch)
Figure 22:
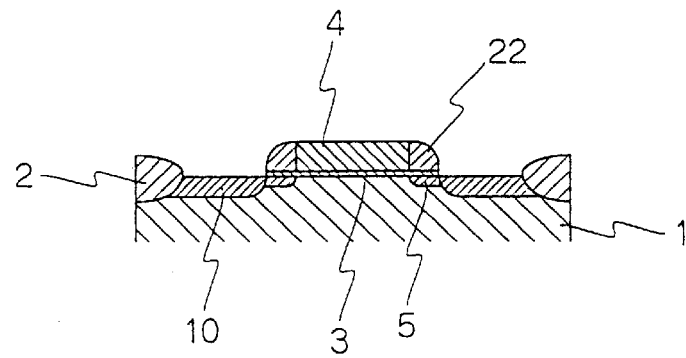
Figure 22:
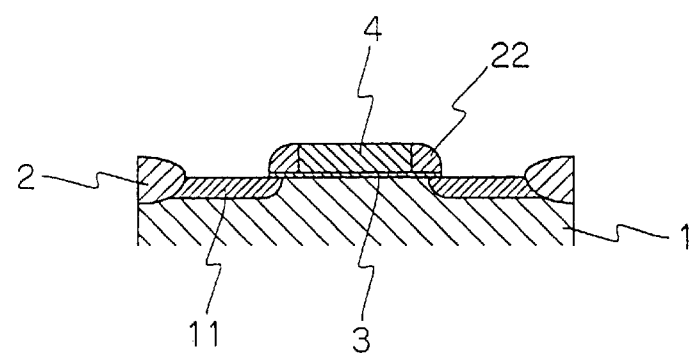
Figure 23:
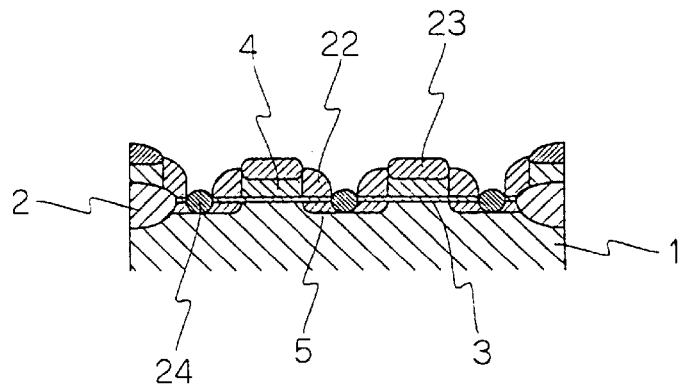
FIG. 23 is a cross-sectional view showing a later step of a second prior art example, FIG. 23(a) being the interior of a memory cell, FIG. 23(b) being a peripheral circuitry section (Nch), and FIG. 23(c) being a peripheral circuitry section (Pch)
Figure 23:
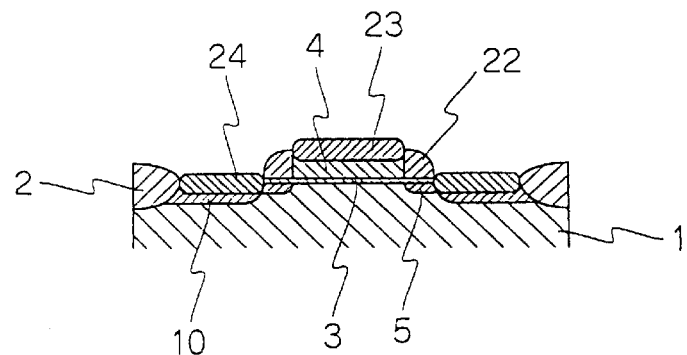
Figure 23:
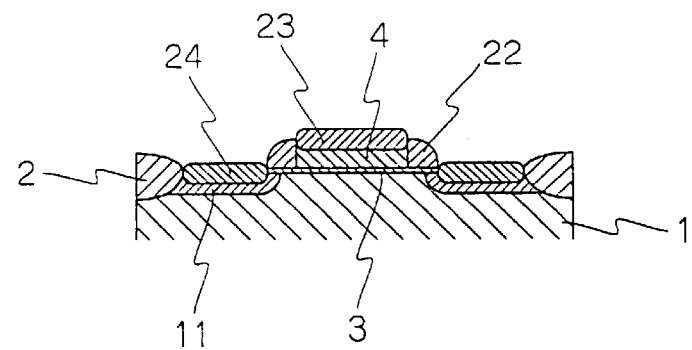
Figure 24:
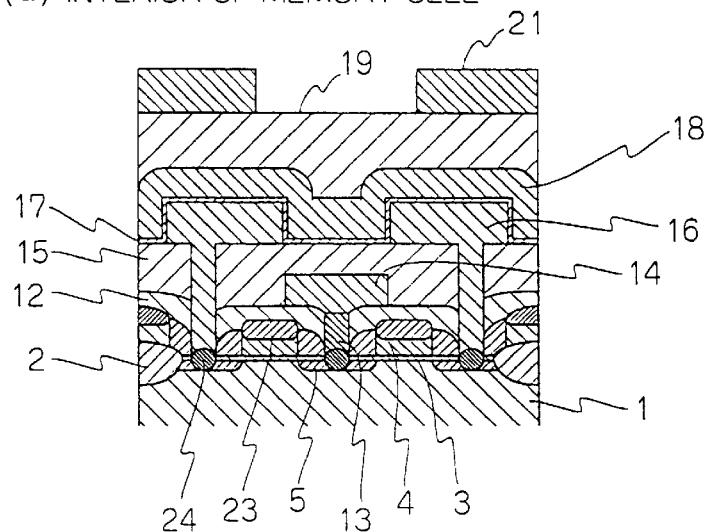
FIG. 24 is a cross-sectional view showing a final step of a second prior art example, FIG. 24(a) being the interior of a memory cell, FIG. 24b) being a peripheral circuitry section (Nch), and FIG. 24(c) being a peripheral circuitry section (Pch).
Figure 24:
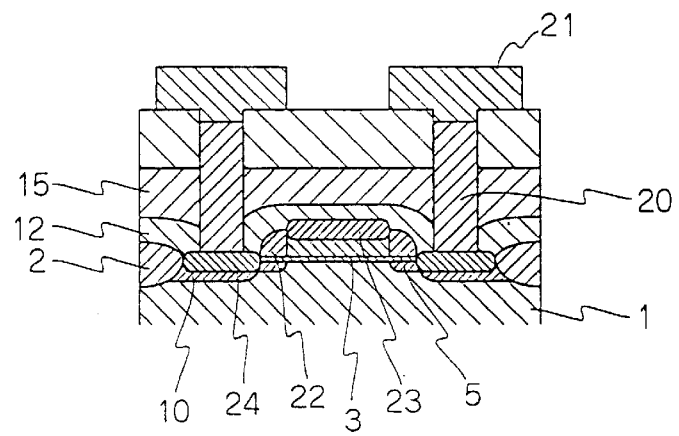
Figure 24:
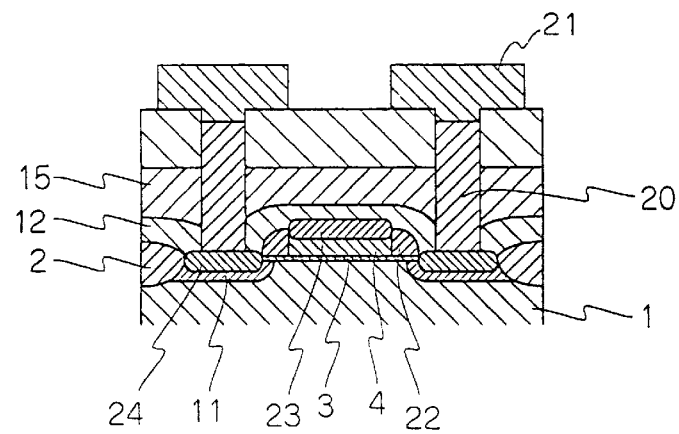

Next, a second embodiment will be described with reference to the drawings. FIG. 9 and FIG. 10 are cross-sectional views of major steps and FIG. 11 is a cross-sectional view of a final step. In the initial, intermediate and major steps, formation is effected in exactly the same way as in the first embodiment and these are as illustrated in FIG. 1 to FIG. 5. By the steps up to this point, the basic structures of the transistor sections of the interiors of the memory cells and peripheral circuitry section are all formed.

Next, as shown in FIG. 9, titanium having a thickness of about 80 [nm] for example, is grown over the entire surface by a sputtering method, and heat treatment is performed under a nitrogen atmosphere. In addition, the unreacted titanium is removed in a mixed liquid of sulphuric acid and hydrogen peroxide. By this means, titanium silicide film 23 is formed on the gates, while titanium silicide film 24 is formed on the diffusion layers. Although titanium silicide films were formed on the diffusion layers and gates, it would be possible to form a film of for example cobalt silicide. Next, as shown in FIG. 10, an inter-layer insulating film 12 such as silicon oxide film containing for example phosphorus and/or boron of thickness for example about 300 [nm] is grown over the entire surface. After this, apertures are formed in prescribed regions in the memory cells and a buried conductive film 13 such as polysilicon containing for example phosphorus is formed within the aperture sections. In addition, bit lines 14 are formed by growing conductive film such as tungsten silicide film of film thickness for example 200 [nm] over the entire surface, followed by patterning.

Next, as shown in FIG. 11, an inter-layer insulating film 15 such as silicon oxide film containing phorus and/or boron of for example film thickness about 300 [nm] is grown over the entire surface and aperture sections are then formed in prescribed regions of the inter-layer insulating film 15. Further, capacitor lower electrodes 16 are formed by growing a conductive film such as polysilicon containing phosphorus of thickness for example about 600 [nm] over the entire surface, followed by patterning to the described shape. Next, capacitor insulating film 17 such as silicon nitride film of thickness for example 6 [nm] is grown over the entire surface and capacitor upper electrodes 18 are then formed only within the memory cells by growing conductive film such as polysilicon containing phosphorus of thickness for example 200 [nm] over the entire surface, followed by patterning. In addition, an inter-layer insulating film 19 produced by a composite film of non-doped silicon oxide film and silicon oxide film containing for example phosphorus and/or boron is grown over the entire surface, followed by formation of aperture sections in prescribed regions of the peripheral circuitry section. Next, low-resistance wiring 21 is formed by forming buried conductive film 20 made of for example tungsten within the aperture sections, then successively forming a film such as aluminium or titanium nitride containing for example titanium, titanium nitride, silicon or copper, followed by patterning.

Since in this embodiment the diffusion layers of the peripheral circuitry section are salicided, the current drive capability of the transistors of the peripheral circuitry section can be improved. Also, since the diffusion layers in the memory cells are not salicided, the increase in junction leakage that would be produced by saliciding can be suppressed.

It should be noted that, although, in the present invention, in the first and second embodiments, a COB (Capacitor On Bitline) structure was adopted in which the storage node electrodes were formed on a layer above the bit line, the invention could likewise be applied also in the case where the bit lines are formed on a layer above the storage electrodes. Also, although, in the first and second embodiments of this invention, DRAM was employed in the memory cells, the invention could be applied also to other memory cells such as SRAMs.

A first benefit of the present invention is as follows. When the side walls of insulating film are formed on the side faces of the gate electrodes in the second region (for example peripheral circuitry section), the space between the electrodes in the first region (for example within the memory cells) is filled by insulating film in self-aligned fashion. Consequently, no extra special steps need to be added to prevent the diffusion layer section of the first region being exposed to the etching atmosphere and the number of steps can therefore be reduced. A second benefit of the present invention is as follows. When performing saliciding on the diffusion layer in the second region, saliciding of the diffusion layer in the first region does not occur, since the spaces between the gate electrodes are filled by insulating film.

There is therefore no need to form deep junctions in the first region in order to withstand saliciding, so the channel-shortening effect of the transistors can be suppressed. Also, increase of junction leakage of the N⁻ diffusion layer due to crystal defects produced by saliciding can be prevented. By this means, an excellent charge-holding characteristic can be maintained in the first region.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 9-161671 (Filed on Jun. 18, 1997) including specification, claims, drawings and summary are incorporated herein by reference in its entirety.

What is claimed is:

1. A method of fabricating a semiconductor device comprising the steps of:
    (a) forming a plurality of first transistors having a first gate electrode separation in a first region on a semiconductor substrate and forming a plurality of second transistors having a gate electrode separation wider than the first gate electrode separation in a second region on the semiconductor substrate;
    (b) covering the entire surface of the first and second regions with an insulating film; and
    (c) forming a buried layer comprising the insulating film between the gate electrodes of each of the plurality of first transistors by etching the entire surface of the insulating film to form side walls on gate electrodes of each of the plurality of second transistors.

2. A method of fabricating a semiconductor device comprising the steps of:
    (a) forming a plurality of first transistors having a first gate electrode separation in a first region on a semiconductor substrate and forming a plurality of second transistors having a gate electrode separation wider than the first gate electrode separation in a second region on the semiconductor substrate;
    (b) covering the entire surface of the first and second regions with an insulating film;
    (c) etching the entire surface of the, insulating film to form a buried layer located between the gate electrodes of each of the plurality of first transistors, and to form side walls on gate electrodes of each of the plurality of second transistors;
    (d) covering the entire surface of the first and second regions with a metallic film; and
    (e) heating to react the metallic film with the base material of the semiconductor substrate.

3. A method of fabricating a semiconductor device comprising the steps of:
    (a) forming a plurality of first transistors having a first gate electrode separation in a first region on a semiconductor substrate and forming a plurality of second transistors having a gate electrode separation wider than the first gate electrode separation in a second region on the semiconductor substrate;
    (b) covering the entire surface of the first and second regions with an insulating film;
    (c) etching the entire surface of the insulating film to form a buried layer located between the gate electrodes of each of the plurality of first transistors, and to form side walls on gate electrodes of each of the plurality of second transistors;
    (d) covering the entire surface of the first and second regions with a metallic film; and
    (e) heating to react the metallic film with the respective base material of the semiconductor substrate and the gate electrodes.

4. The method of fabricating a semiconductor device according to claim 1, wherein the film thickness of the insulating film D and the gate electrode separation distance S of each of the plurality of first transistors satisfy the relationship S<2×D.

5. The method of fabricating a semiconductor device according to claim 2, wherein the film thickness of the insulating film D and the gate electrode separation distance S of each of the plurality of first transistors satisfy the relationship S<2×D.

6. The method of fabricating a semiconductor device according to claim 3, wherein the film thickness of the insulating film D and the gate electrode separation distance S of each of the plurality of first transistors satisfy the relationship S<2×D.

7. The method of fabricating a semiconductor device according to claim 1, wherein said step of covering the entire surface of the first and second regions with an insulating film comprises fabricating a film having good step coverage.

8. The method of fabricating a semiconductor device according to claim 2, wherein said step of covering the entire surface of the first and second regions with an insulating film comprises fabricating a film having good step coverage.

9. The method of fabricating a semiconductor device according to claim 3, wherein said step of covering the entire surface of the first and second regions with an insulating film comprises fabricating a film having good step coverage.

10. The method of fabricating a semiconductor device according to claim 1, wherein said step of covering the entire surface of the first and second regions with an insulating film comprises one of a CVD process and a sputtering process.

11. The method of fabricating a semiconductor device according to claim 2, wherein said step of covering the entire surface of the first and second regions with an insulating film comprises one of a CVD process and a sputtering process.

12. The method of fabricating a semiconductor device according to claim 3, wherein said step of covering the entire surface of the first and second regions with an insulating film comprises one of a CVD process and a sputtering process.

13. The method of fabricating a semiconductor device according to claim 1, wherein said step of etching the entire insulating film comprises one of anisotropic etching and RIE.

14. The method of fabricating a semiconductor device according to claim 2, wherein said step of etching the entire insulating film comprises one of anisotropic etching and RIE.

15. The method of fabricating a semiconductor device according to claim 3, wherein said step of etching the entire insulating film comprises one of anisotropic etching and RIE.

16. The method of fabricating a semiconductor device according to claim 1, wherein the semiconductor device is a memory element, the first region is the interior of memory cells, and the second region is a peripheral circuitry section.

17. The method of fabricating a semiconductor device according to claim 2, wherein the semiconductor device is a memory element, the first region is the interior of memory cells, and the second region is a peripheral circuitry section.

18. The method of fabricating a semiconductor device according to claim 3, wherein the semiconductor device is a memory element, the first region is the interior of memory cells, and the second region is a peripheral circuitry section.

19. The method of fabricating a semiconductor device according to claim 2, wherein a base material of the semiconductor substrate is silicon and the metallic film is one of titanium and a transition metal element.

20. The method of fabricating a semiconductor device according to claim 3, wherein a base material of the semiconductor substrate is silicon and the metallic film is one of titanium and a transition metal element.

21. The method of fabricating a semiconductor device according to claim 3, wherein the gate electrodes comprise one of polysilicon and silicide.

22. The method of fabricating a semiconductor device according to claim 1, wherein said step of covering the entire surface of the first and second regions with an insulating film comprises filling areas between the gate electrodes of the plurality of first transistors.

23. The method of fabricating a semiconductor device according to claim 2, wherein said step of covering the entire surface of the first and second regions with an insulating film comprises filling areas between the gate electrodes of each of the plurality of first transistors.

24. The method of fabricating a semiconductor device according to claim 3, wherein said step of covering the entire surface of the first and second regions with an insulating film comprises filling areas between the gate electrodes of each of the plurality of first transistors.

25. The method of fabricating a semiconductor device according to claim 1, wherein said step of etching the entire surface of the insulating film comprises etching the top surface of each gate electrode of the plurality of first transistors to completely remove all of the insulating film from each of the top surfaces.

26. The method of fabricating a semiconductor device according to claim 2, wherein said step of etching the entire surface of the insulating film comprises etching the top surface of each gate electrode of the plurality of first transistors to completely remove all of the insulating film from each of the top surfaces.

27. The method of fabricating a semiconductor device according to claim 3, wherein said step of etching the entire surface of the insulating film comprises etching the top surface of each gate electrode of the plurality of first transistors to completely remove all of the insulating film from each of the top surfaces.

* * * * *